United States Patent
Masleid

(10) Patent No.: US 6,630,851 B2
(45) Date of Patent: Oct. 7, 2003

(54) LOW LATENCY CLOCK DISTRIBUTION

(75) Inventor: Robert P Masleid, Monte Soreno, CA (US)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/040,750

(22) Filed: Dec. 28, 2001

(65) Prior Publication Data

US 2003/0011413 A1 Jan. 16, 2003

Related U.S. Application Data

(60) Provisional application No. 60/301,884, filed on Jun. 29, 2001.

(51) Int. Cl.[7] .................................................. H03K 5/01
(52) U.S. Cl. ........................................ 327/165; 327/299
(58) Field of Search ................................. 327/165, 166, 327/170, 172, 176, 185, 291–294, 299; 326/56

(56) References Cited

U.S. PATENT DOCUMENTS

| | | | |
|---|---|---|---|
| 5,610,548 A | 3/1997 | Masleid | 327/374 |
| 5,614,845 A | 3/1997 | Masleid | 326/93 |
| 5,656,963 A | 8/1997 | Masleid et al. | 327/297 |
| 5,894,419 A | 4/1999 | Galambos et al. | 364/488 |
| 5,926,050 A * | 7/1999 | Proebsting | 327/170 |
| 6,025,738 A | 2/2000 | Masleid | 326/83 |
| 6,323,706 B1 * | 11/2001 | Stark et al. | 327/175 |
| 6,366,115 B1 * | 4/2002 | DiTommaso | 326/32 |
| 6,426,652 B1 | 7/2002 | Greenhill et al. | |
| 6,466,063 B2 * | 10/2002 | Chen | 327/112 |

OTHER PUBLICATIONS

Stojanovic, V. and Oklobdzija, V. "Comparative Analysis of Master–Slave Latches and Flip–Flops for High–Performance and Low–Power Systems", IEEE Journal of Solid-State Circuits, vol. 34, No. 4, Apr. 1999, pp. 536–548.

* cited by examiner

Primary Examiner—My-Trang Nu Ton
(74) Attorney, Agent, or Firm—Fenwick & West LLP

(57) ABSTRACT

A system and method for distributing clock signal information as rising and falling edge signals is disclosed. In one embodiment a first pulse signal includes a pulse generated for the rising edge of each clock pulse signal includes a pulse generated for the falling edge of each clock pulse. The temporal information associated with the time delay of the leading edges of corresponding pulses of the first and second pulse signals may be used to recover the clock signal. In one embodiment, skewed amplifiers are used to amplify the first and second pulse signal edge pulse. In one embodiment, the first and second pulse signals are regenerated and amplified before they are and into a tri-state buffer to recover the clock signal.

35 Claims, 12 Drawing Sheets

US 6,630,851 B2

LOW LATENCY CLOCK DISTRIBUTION

RELATED APPLICATIONS

This application claims priority under 35 U.S.C. §119(e) to U.S. patent application No.: 60/301,884, "Low Latency Clock Distribution," by Robert Masleid, which was filed Jun. 29, 2001, the entire contents of which are hereby incorporated by reference in the present patent application.

BACKGROUND OF THE INVENTION

1. Field of the Invention

The present invention related generally to systems and methods for distributing a clock signal in an integrated circuit.

2. Description of Background Art

There is increasing interest in high-speed microprocessors, such as microprocessors with a clock cycle frequency greater than one Gigahertz. It is desirable to distribute the clock signal across the microprocessor with a low variance in the latency at different clock distribution points of the chip.

FIG. 1 shows an exemplary clock signal distribution network 100. A common clock distribution network is a clock tree 100 that fans out at each clock buffer 104 to distribute the signal to higher level branches 106 of the clock tree. The clock signal (or its logical complement) is reproduced by each buffer 104. The clock buffers are commonly inverters. The reproduced clock signal and/or its logical complement is, in turn, coupled to other clock buffers at higher levels of the clock tree. Referring to FIG. 1, typically, a master clock signal 102 is generated having a duty cycle of approximately 50%, i.e. the clock pulse is high for about half of the clock period and low for the other of the clock period. The clock signal distribution network may include a variety of clock buffers.

A clock tree for driving a large number of latches must typically have a substantial number of levels due to the limited fan out possible from a single clock buffer 104. The number of levels of the clock tree will depend, in part, upon the fan out possible with each clock buffer and upon how many latches the clock must drive. As an illustrative example, if there are 100,000 latches that need to be driven and each clock buffer 104 has a gain of a little over three, a total of approximately ten to eleven levels are required in the clock tree so that the cumulative fan out is sufficient to drive the latches (i.e., $3^{11}>100,000$).

The latency for clock signals to traverse from the original clock source 102 to a distribution point of the clock tree will depend upon the time delay in each clock buffer 104 and upon the number of clock levels that the signal must traverse, i.e. the total number of clock buffers along the path. The performance of clock tree 100 will be affected by the gain per delay characteristics of each of the clock buffer 104 of the clock tree. The gain per delay is a frequently used figure of merit. Generally speaking, a high gain per delay is desirable in a clock buffer stage.

The design of the clock buffer 104 is limited by numerous factors. FIG. 2 shows an exemplary clock buffer stage similar to that described in U.S. Pat. No. 6,024,738 by Masleid, the contents of which are hereby incorporated by reference. The design of clock buffer 201 is limited by the requirement that the clock signal be reproduced at the output of the clock buffer 201. An input 1 receives a clock signal having an approximately 50% duty cycle via a single wire input. A pulse generator stage comprising logic gates 203, 205 and 207 creates two sets of pulses, corresponding to rising edge pulses and falling edge pulses at outputs 2 and 6, respectively. Inverters 209 and 211 amplify the rising edge pulses whereas inverters 215 and 217 amplify the falling edge pulses. The output 4 of inverter 211 and the output 8 of inverter 217 are input to a tristate buffer comprising transistors 213 and 219 to reconstruct the clock signal from the amplified rising edge pulses and amplified falling edge pulses.

The delay associated with each clock buffer 201 is determined by several factors. The delay associated with the amplifying inverters 209, 211, 215, and 217 can be reduced, somewhat, by using skewed amplifiers having a logical threshold selected to favor the propagation of either a falling or rising edge through the inverter. However, in a conventional clock buffer 201 there are limitations imposed on the number of skewed amplifying inverters that can be used as an amplifying chain because of the increase in pulse width associated with the skew of the inverters 209, 211, 215, and 217.

FIG. 3 is a diagram of illustrative signal intensities versus time along selected portions of buffer 201. For the purposes of illustration, the signals are shown relative to a common time axis. Signal plot 301 corresponds to the signal of the clock at point 1, signal plot 302 corresponds to the output 2 of the rising pulse generator, signal plot 303 corresponds to the output of inverter 209, and signal plot 304 corresponds to the output of inverter 211. Signal plot 306 corresponds to the output of pulse generator 207, signal plot 307 corresponds to the output of inverter 215, and signal plot 308 corresponds to the output of inverter 217. Signal plot 305 corresponds to the reconstructed clock signal at clock output 5, which is delayed in time compared to the input clock signal 301 due to capacitive and other effects.

FIG. 3 illustrates how the pulse width changes as signals traverse the skewed inverter buffers. Signal plots 303 and 304 illustrate how the inverters 209 and 211 broaden the rising edge pulses. Similarly, signal plots 307 and 309 illustrate how inverters 215 and 217 broaden the falling edge pulses. The skewed amplifiers 209, 211, 215, and 217 favor the propagation of a leading edge but result in an increase in pulse width. The increase in pulse width in each skewed inverter limits the number of inverter stages and/or the gain per delay. This is because the pulses of signal plots 304 and 308 must be non-overlapping (e.g., have a pulse duty cycle of less than 50%) for the tristate buffer comprised of transistors 213 and 219 to recover the clock signal. Consequently, the design of the amplifying inverters of clock buffer 201 is limited by the requirement of the tristate buffer of transistors 213 and 219 that outputs 304 and 308 be nonoverlapping, i.e. that each have a duty cycle of less than about 50%.

A consequence of the limitations of conventional clock buffer 201 is that the clock buffer may have a smaller gain per delay than desired which, in turn, may result in a conventional clock tree 100 having a larger latency than desired. This is of particular concern in high speed microprocessors operating at a high clock rate. Moreover, the limitations of clock buffer 201 may be expected to become more severe in their effects as clock rates increase and as the number of clock tree levels increases.

What is desired is a clock buffer and clock distribution network having reduced latency.

SUMMARY OF THE INVENTION

A clock signal distribution network is disclosed in which the clock signal information is distributed in one or more levels of a clock tree as at least two signals indicative of each instance of a rising edge and a falling edge of the clock. These signals are transmitted in separate wires of a bus and used to recover the clock signal at another location in a clock tree.

In one embodiment, a first signal is a pulse signal that is a first sequence of pulses with one pulse generated for each rising edge of the clock signal and the second signal is a pulse signal that is a second sequence of pulses with one pulse generated for each falling edge of the clock signal. The first and second pulses signals are amplified in first and second skewed amplifiers that favor the propagation of the leading edge of each pulse. Since the clock information is contained in the timing of the leading edges of the first and second signals, the skew of the amplifier can be selected to reduce the delay associated with the amplifiers. The timing information is retained as long as each pulse of the first and second pulse signals has a pulse width less than the clock pulse width. Consequently, in one embodiment the skew characteristics of the first and second skewed amplifiers may be selected such that each pulse of the first and second pulse signals has a pulse width in the range of 5% to 95% of the clock period.

Each pulse signal may be transmitted to another clock distribution point using separate wires of a two wire bus. The clock signal may be recovered by regenerating pulses of the first and second pulse signals using pulse generators configured to generate new pulses responsive to the leading edges of input pulses. The regenerated first and second pulse signals may then be amplified in third and fourth skewed amplifiers and preferably have a pulse width selected so that they may be input to a tristate buffer to recover the clock signal.

DETAILED DESCRIPTION OF THE PREFERRED EMBODIMENTS

Figure 1:
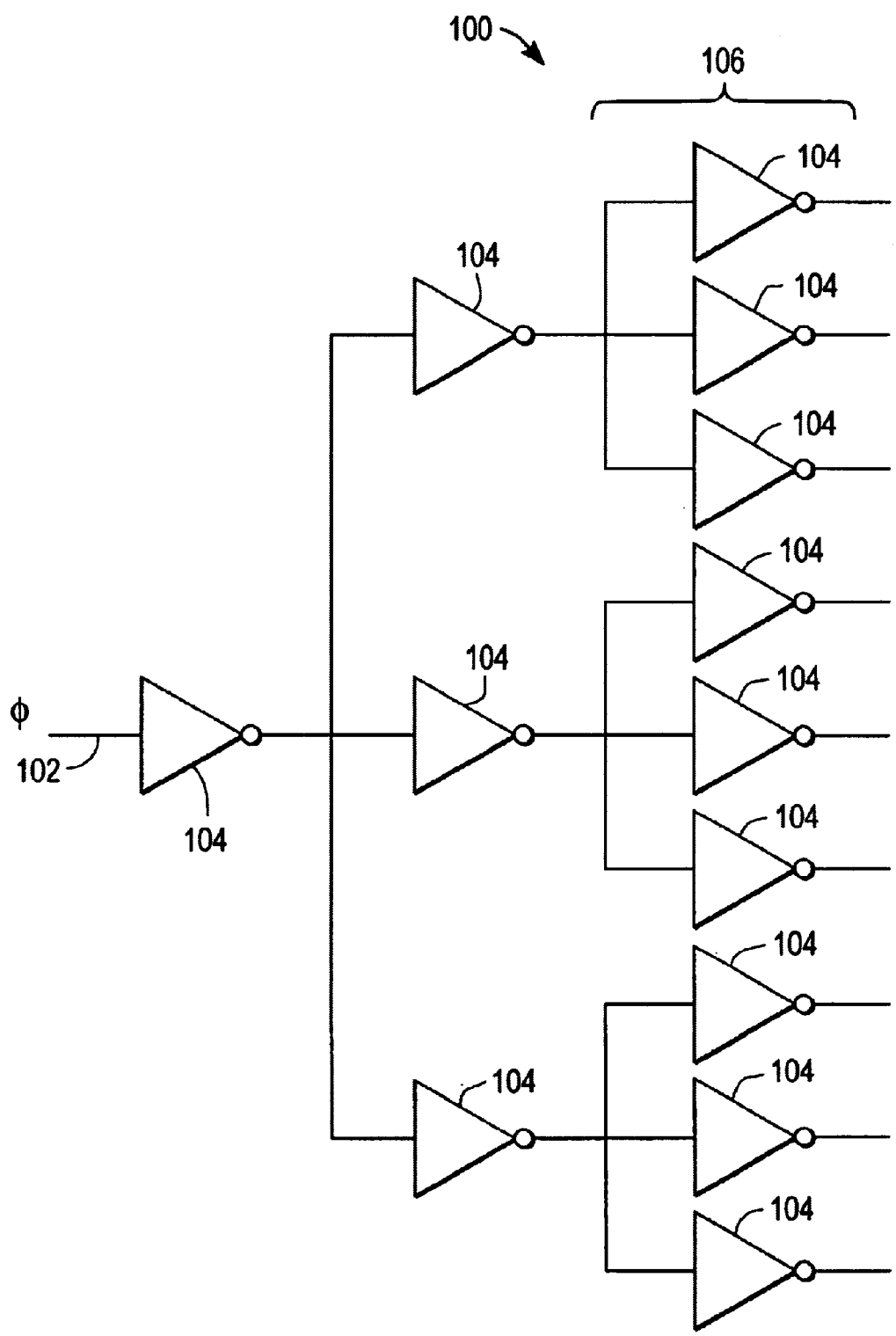
FIG. 1 is a block diagram of a prior art clock signal distribution network.
Figure 2:
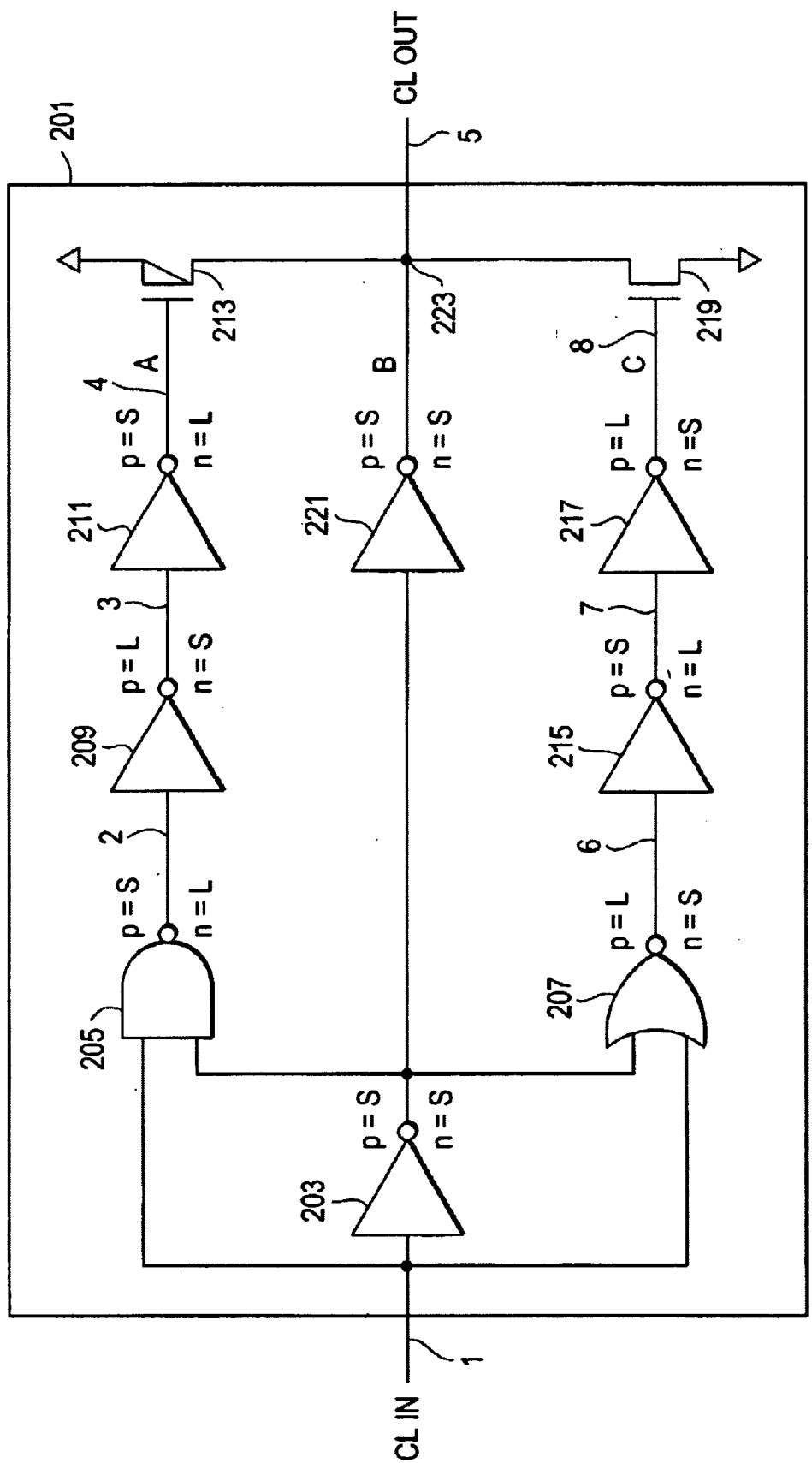
FIG. 2 is a block diagram of a prior art clock buffer for use in a single wire clock signal distribution network.
Figure 3:
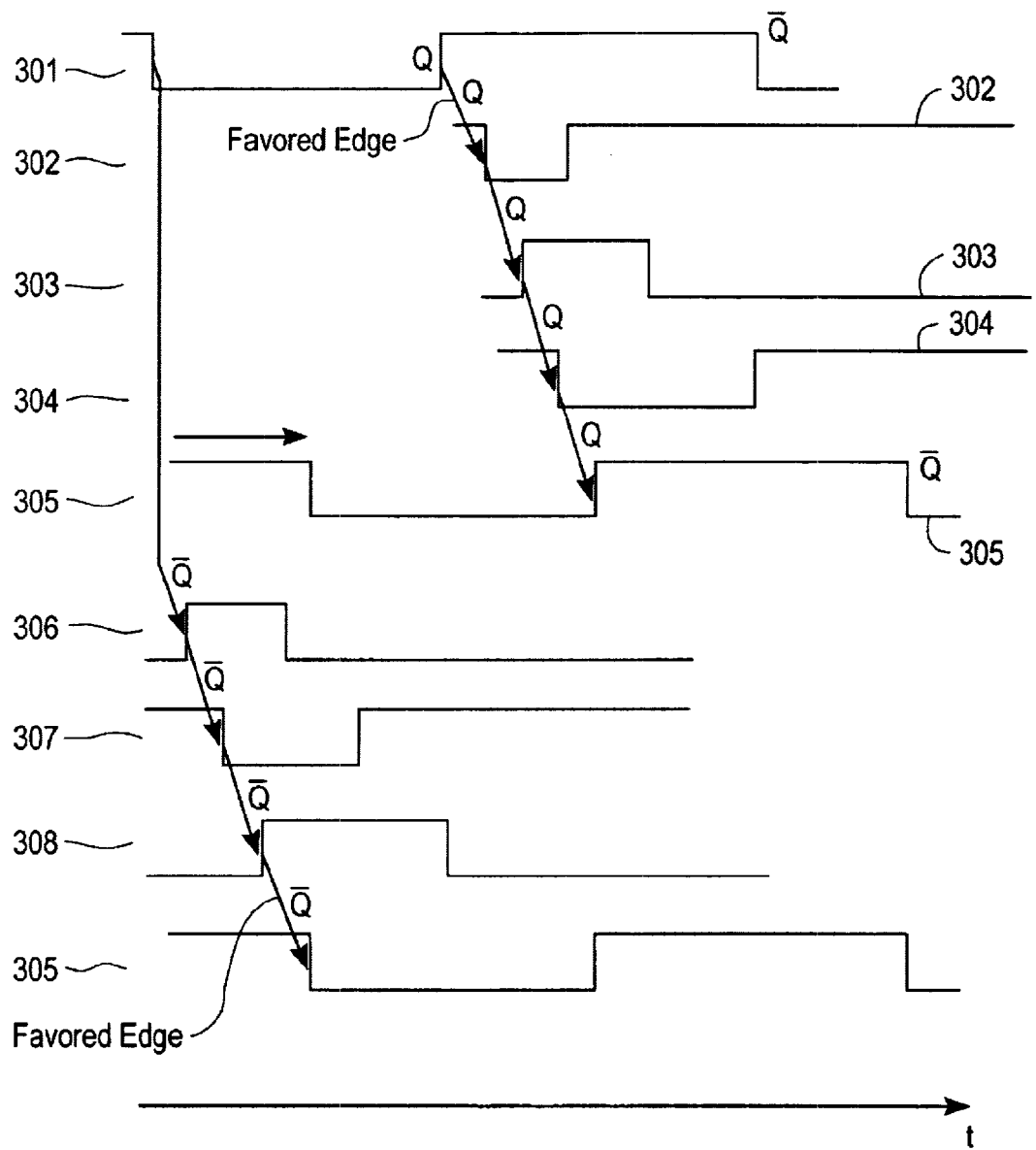
FIG. 3 shows illustrative signals versus time at selected portions of the clock buffer of FIG. 2.
Figure 4A:
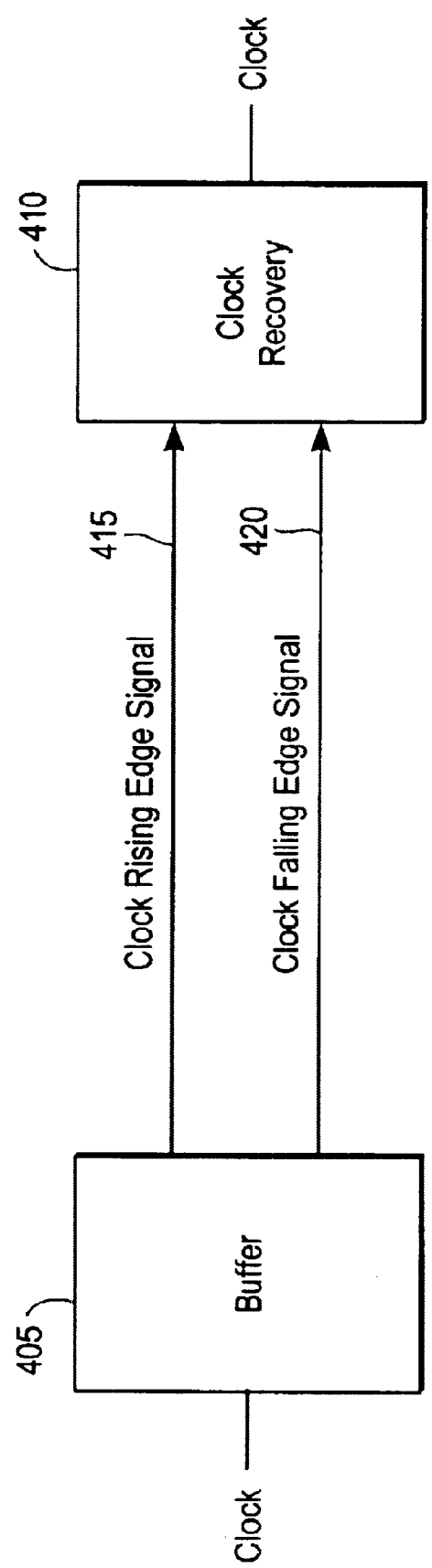
FIG. 4A is a block diagram of one embodiment of a portion of a clock signal distribution network.

The present invention generally includes a clock buffer circuit for use as part of a clock signal distribution network. FIG. 4A is a high-level block diagram illustrating some of the principles of one embodiment. A buffer 405 receives a clock signal having a plurality of clock pulses. The buffer generates at least two signals that include information regarding each instance of a rising edge of the clock pulse and each instance of the falling edge of the clock pulse. This information may be transmitted using a suitable bus to a clock recovery circuit 410 that recovers the clock signal. In one embodiment this information is transmitted in a two-wire bus as a rising edge signal 415 and a falling edge signal 420. The bus may include suitable repeaters, if necessary, to maintain the strength of the signal. As described below in more detail, the bus is preferably arranged so that the two signals have approximately the same propagation delay to clock recovery circuit 410.

Figure 4B:
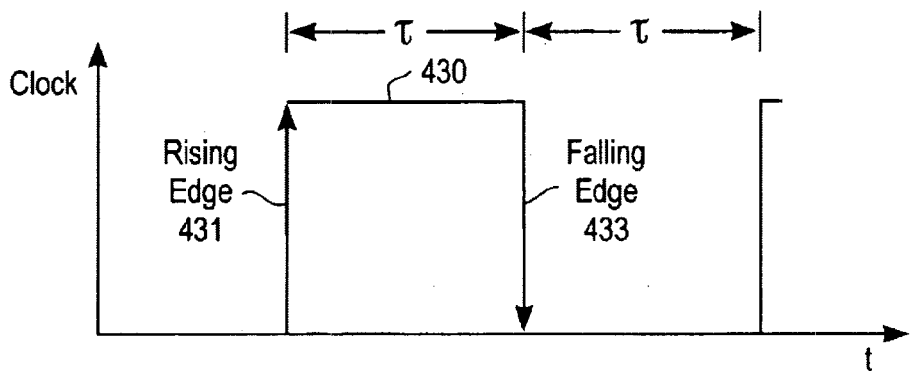
FIG. 4B is an illustrative plot of a clock pulse for the embodiment of FIG. 4A.

Referring to FIG. 4B, each clock pulse of a clock signal has a rising edge 431 and a falling edge 433. The clock pulse 430 has a width, Γ, that is approximately half the clock period. The information of the clock pulse can be transmitted as information indicative of an instance of the rising edge 431 and an instance of the falling edge 433, since this information is sufficient to reconstruct a clock pulse with the width, Γ, at another location. It will be understood throughout the following discussion that the logical complement of a pulse may also be used to transmit the same timing information.

Figure 4C:
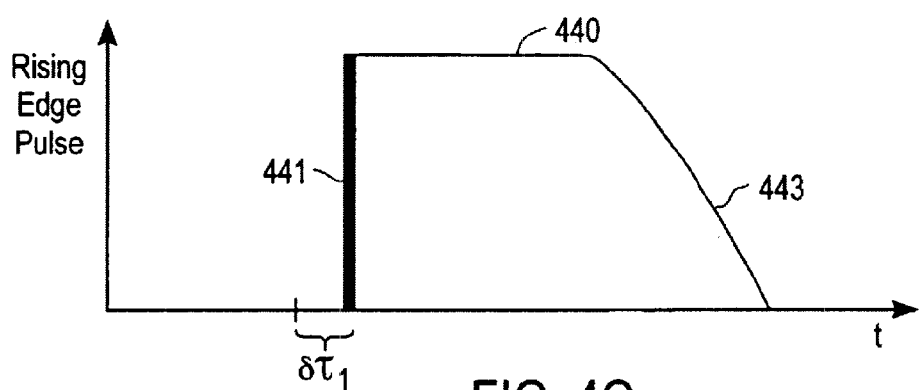
FIG. 4C shows an illustrative rising edge clock pulse signal for the embodiment of FIG. 4A.

In one embodiment, the information associated with the rising and falling edges of each clock pulse is transmitted in the form of a single rising edge pulse and a single falling edge pulse generated for each clock pulse 430. As illustrated in FIG. 4C, in one embodiment, the generation of a rising edge pulse 440 having a favored (leading) edge 441 is triggered by each rising edge 431 of the clock pulse 430. Over a number of clock periods, this results in a first pulse signal comprising a first sequence of pulses. The favored edge 441 is offset in time from rising edge 431 by a first delay time, δt1, (e.g., a trigger delay time). There is also an unfavored (trailing) edge 443 of pulse 440, i.e., a second edge of the pulse that does not carry timing information regarding the occurrence of the rising edge 431.

Figure 4D:
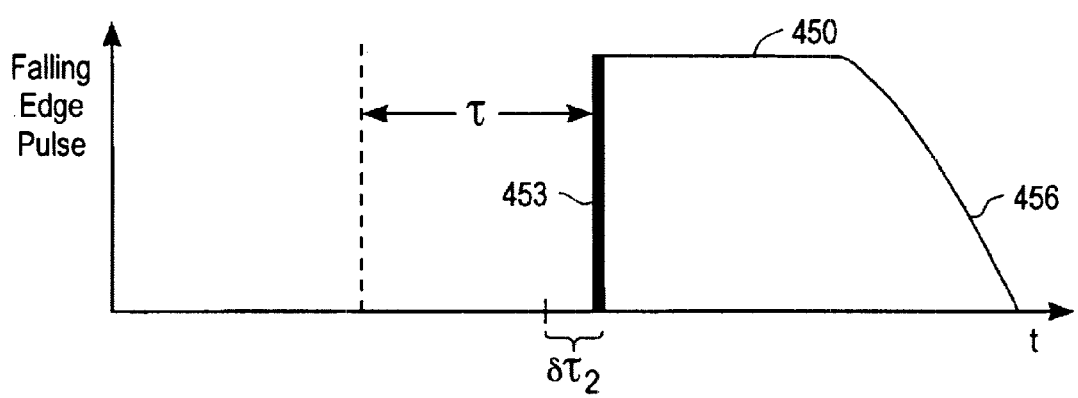
FIG. 4D shows an illustrative falling edge clock pulse signal for the embodiment of FIG. 4A.

Referring to FIG. 4D, the generation of a falling edge pulse 450 having a favored (leading) edge 453 is triggered by the falling edge 433 of clock pulse 430. Over a number of clock periods, this results in a second pulse signal comprising a second sequence of pulses. The favored edge 453 is offset from falling edge 433 of clock pulse 430 by a second delay time, δt2 (e.g., a second trigger delay time). Falling edge pulse 450 also has an unfavored (trailing) edge 456 that does not carry information regarding the occurrence of falling edge 433. If the circuits used for generating the rising and falling edge pulses are suitably selected, then δt1≈δt2. It can be seen by comparing FIGS. 4C and 4D that the information associated with the clock pulse width Γ can be recovered from the temporal separation of favored leading edges 441 and 453.

One benefit of transmitting clock pulse information in the form of a rising edge pulse 440 and a falling edge pulse 450 is that it permits greater freedom in selecting the skew of the buffer 405 compared to transmitting a single clock pulse. This permits, for example, greater freedom to select the skew to reduce the delay of propagating favored leading edges 441 and 453 through buffer 405. As indicated in FIGS.

4C and 4D, since the clock information is conveyed on favored leading edges 441 and 453 of the rising and falling edge pulses, respectively, the shape of the unfavored trailing edges 443 and 456 is unimportant so long as the total width of each pulse 440 and 450 does not exceed the time period of the clock. This permits a substantial degree of skew to be used in the initial amplification of rising and falling edge pulses 440 and 450 in buffer circuit 410. Amplifiers with a high degree of skew may be designed to have a reduced delay in regards to transmitting a favored leading edge. However, a high degree of skew also tends to result in an increase in pulse width associated with broader trailing edges 443 and 456.

Figure 5:
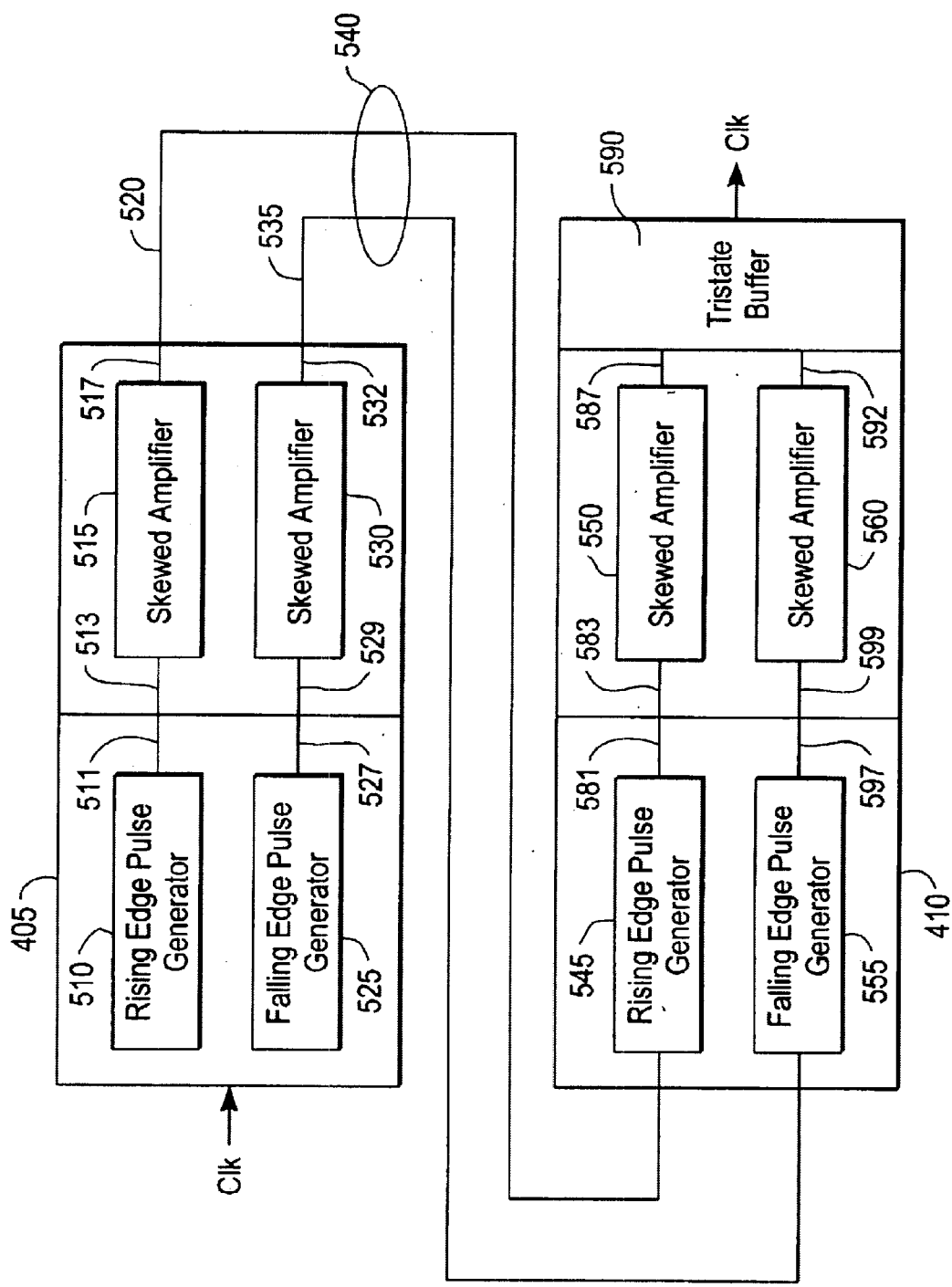
FIG. 5 is a block diagram of an embodiment of a two-wire clock signal distribution system.

FIG. 5 is a block diagram of one embodiment of a clock signal distribution circuit having a clock buffer 405 and a clock recovery circuit 410. In the clock buffer, a rising edge pulse generator 510 receives the clock signal and generates a pulse for each rising edge of the clock. The rising edge generator is preferably a pulse generator that generates a pulse that has a smaller time duration than the clock pulse (e.g., 5%–20% of the clock period). The output 511 of the rising edge pulse generator is coupled to the input 513 of a first skewed amplifier 515 that favors the propagation of a favored edge 441 that conveys information associated with the instance of the rising edge of a clock pulse. Any suitable skewed amplifier 515 may be used, such as a chain of skewed inverters coupled end-to-end. This results in a rising edge pulse signal 520 at the output 517 of skewed amplifier 515. A falling edge pulse generator 525 generates a pulse for each falling edge of the clock. The falling edge pulse generator is preferably a pulse generator that generates a pulse that has approximately the same time duration as for the rising edge generator (e.g., 5%–20% of the clock period). The output of the falling edge pulse generator is coupled to the input 529 of a second skewed amplifier 530 that favors the propagation of a favored edge associated with the occurrence of the falling edge of the clock pulse. This results in a falling edge pulse signal 535 at the output 532 of skewed amplifier 530.

A data bus, such as a two-wire bus 540, is used to transmit the rising edge pulse signal 520 and falling edge pulse signal 535 to another location on the integrated circuit. The bus is preferably a bus designed to have the same propagation time for both pulse signals.

In one embodiment, the clock signal may be recovered at a clock recovery circuit 410 by regenerating the rising and falling edge signal as short pulses using third and fourth pulse generators 545 and 555, amplifying the shortened pulses in skewed amplifiers 550 and 560, and driving a tri-state buffer 590 with the outputs 587 and 592 of skewed amplifiers 550 and 560. In one embodiment, rising edge pulse generator 545 regenerates a rising edge pulse responsive to receiving the favored edge of the rising edge pulse signal 540 from the two wire bus. The output 581 of second rising edge pulse generator 545 is coupled to the input 583 of skewed amplifier 550 resulting in an amplified rising edge pulse signal 587. The regenerated rising edge pulse preferably has a comparatively short pulse length compared with the clock period and is amplified in a skewed amplifier 550 that favors the propagation of the leading edge. In one embodiment, falling edge generator 555 regenerates a falling edge pulse responsive to receiving to receiving the favored edge of the falling edge pulse signal 535 from the two wire bus. Falling edge pulse generator 555 generates a short pulse at its output 597 responsive to each falling edge of input signal 535. The output 597 of falling edge pulse generator 555 is coupled to the input 599 of skewed amplifier 560, resulting in an amplified regenerated falling edge pulse signal 592.

Tables I and II show exemplary ranges of pulse widths at different locations in the circuit of FIG. 5 for rising edge pulses and falling edge pulses, respectively. It can be seen in Tables I and II, that in the present invention the range of pulse widths of rising and falling edge pulse signals 530 and 540 may be selected to be considerably greater than 50% of the clock period to reduce the delay of skewed amplifiers 515 and 530. It will be understood that the exemplary high and low values reflect desirable timing margins less stringent than the extreme values to facilitate manufacturability.

TABLE I

Exemplary pulse widths of rising edge pulse signals.

| Circuit Location | Exemplary Range of Pulse Widths With Respect To Clock Pulse Width |
| --- | --- |
| Rising Edge Pulses From Output 511 of First Rising Edge Pulse Generator 510 | Shorter than the clock pulse width to permit increase in pulse width, e.g., 5%–95%, with 10% being a preferred low value. |
| Amplified Rising Edge Pulses From Output 517 Of Skewed Amplifier 515 | Between 5%–95% as long as less than 100%, with 90% being a preferred high value. |
| Regenerated Rising Edge Pulses From Output 581 of Second Rising Edge Pulse Generator 545 | Shorter than the clock pulse width, e.g., 5%–45%, with 10% being a preferred low value. |
| Amplified Regenerated Rising Edge Pulses From Output 587 Of Skewed Amplifier 550 | Shorter than the clock pulse width, e.g., 5%–45% to permit recovery of the clock signal in a buffer, with 40% being a preferred high value. |

TABLE II

Exemplary pulse widths of falling edge pulse signals.

| Circuit Location | Exemplary Range of Pulse Widths With Respect To Clock Pulse Width |
| --- | --- |
| Falling Edge Pulses From Output 527 of First Falling Edge Pulse Generator 525 | Shorter than the clock pulse width to permit increase in pulse width, e.g., 5%–95%, with 10% being a preferred low value. |
| Amplified Falling Edge Pulses From Output 532 Of Skewed Amplifier 530 | Between 5%–95% as long as less than 100%, with 90% being a preferred high value. |
| Regenerated Falling Edge Pulses From Output 597 of Second Falling Edge Pulse Generator 555 | Shorter than the clock pulse width, e.g., 5%–45%, with 10% being an exemplary low value. |
| Amplified Regenerated Falling Edge Pulses At Output 592 of Skewed Amplifier 560. | Shorter than the clock pulse width, e.g., 5%–45% to permit recovery of the clock signal in a buffer, with 40% being a preferred high value. |

Figure 6:
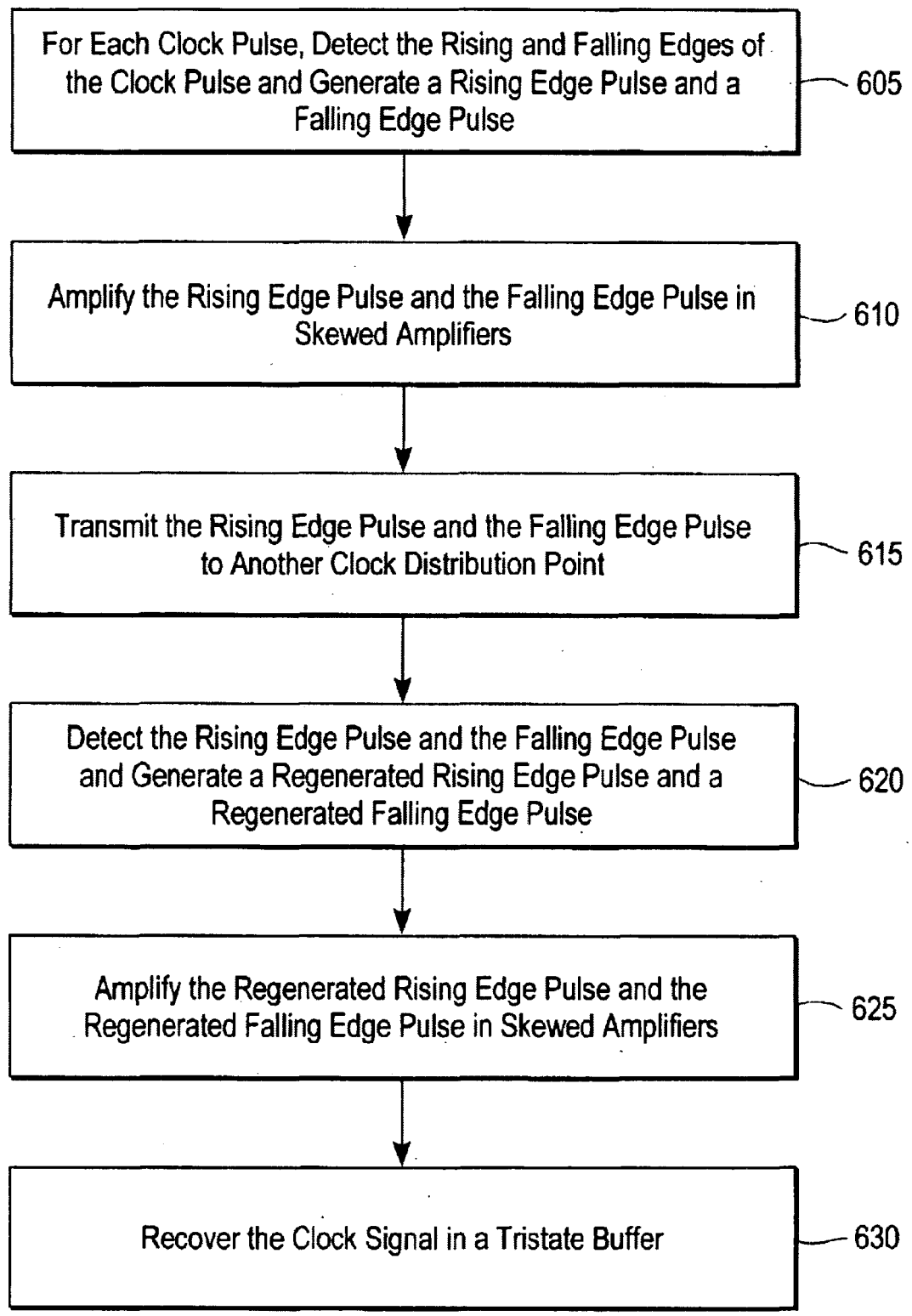
FIG. 6 is a flow chart of an embodiment of a method of distributing clock signals.

FIG. 6 shows an illustrative method of operation for the circuit of FIG. 5. In buffer 405, for each clock pulse the rising and falling edges of each clock pulse are detected and rising and falling edge pulses generated 605. For each clock pulse the rising and falling edge pulses are amplified in skewed amplifiers 610 and transmitted to at least one other clock distribution point 615. At the receiving clock distribution point the rising and falling edge pulse are regenerated 620. In one embodiment this includes detecting the favored edge of each rising or falling edge pulse and generating a new pulse responsive to the detecting the favored edge. This results in regenerated rising and falling edge pulses. The regenerated rising edge and falling edge pulses are then amplified in skewed amplifiers 625. The clock signal is recovered 630 using a buffer, such as a tri-state buffer.

One benefit of the present invention is that the skew characteristics of the skewed amplifiers 515 and 530 can be selected to beneficially reduce the gain per delay in buffer 405. This is, in part, due to the fact that the skewed amplifier may be selected to produce rising and falling edge pulses 440 and 450 that each have a pulse width, relative to their respective favored edges 441 and 453, that is not restricted to be less than half the clock period, thereby providing greater design freedom in regards to selecting skewing characteristics that minimize the time delay through the amplifier. Since the pulse generators in the clock recovery and buffer 410 regenerate new pulses responsive to the favored edges, the rising and falling edge pulses generated by buffer 405 need only have a pulse width that is somewhat less than the clock period in order that the pulse generators 545 and 555 of clock recovery circuit 410 regenerate the pulses. As an illustrative example, in one embodiment the rising edge pulses and falling edge pulses generated by buffer 405 may have a skewed pulse width, relative to their favored edges, of between 5% to 95% of the clock period.

In one embodiment the pulse generators 545 and 555 generate pulses with a comparatively narrow pulse width, e.g., each initial rising or falling edge pulse has a width of about 10% of the clock period or less, although it will be understood that a range of 5%–45% may be suitable for recovering the clock signal in clock recovery circuit 410. The pulse width of regenerated rising edge pulse and regenerated falling edge pulses is preferably selected in conjunction with the skew characteristics of skewed amplifiers 550 and 560 to reduce the delay associated with clock recovery circuit 410 consistent with the amplified regenerated rising edge pulses 587 and amplified regenerated falling edge pulses having a pulse width sufficiently below 50% to permit recovering the clock signal in a buffer 590. For example, some tristate buffers require that the amplified regenerated rising and falling edge pulses have a pulse width of at most about 40%–45% to provide a sufficient timing margin to operate properly.

Figure 7:
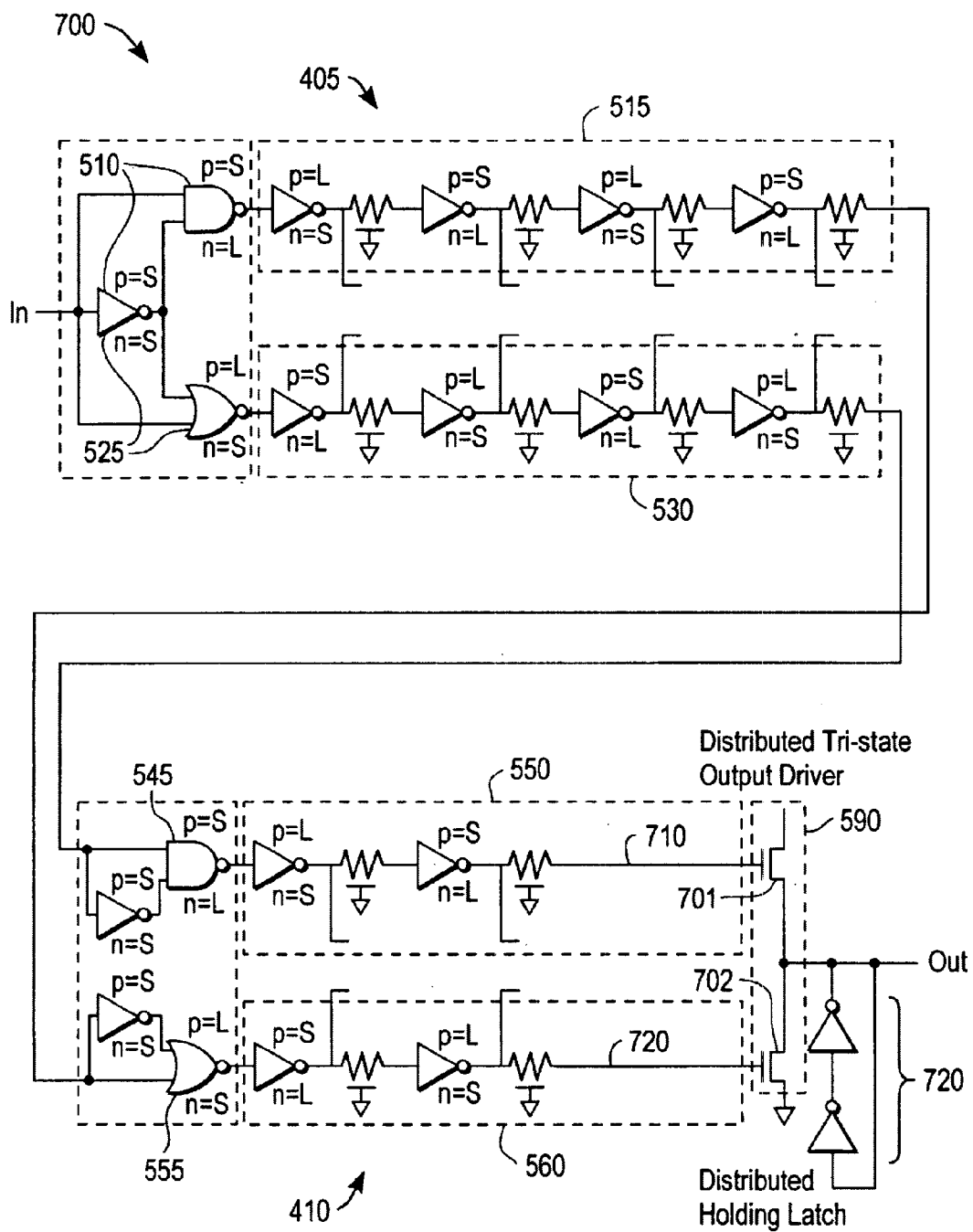
FIG. 7 shows a circuit diagram of an embodiment of a two-wire clock signal distribution of FIG. 5.

FIG. 7 is a circuit diagram of one embodiment of a clock buffer 405 and clock buffer and recovery circuit 410. In one embodiment, skewed amplifiers 515 and 530 each comprise a chain of amplifying inverters coupled end-to-end with the relative size of the transistors in each inverter selected to produce a desired skew. In accord with standard design procedure, additional resistors and capacitors may be placed between each of the inverters to represent the wiring connecting the inverters. This wiring may form part of the clock distribution. The rising and falling edge pulses may be generated using any suitable logic gate circuit. For example, the rising edge pulses may be generated from the output of a NAND gate receiving the clock signal and a complementary clock signal received from an inverter. The falling edge pulses may be generated from the output of a NOR gate receiving the clock signal and a complementary clock signal from an inverter. The delay characteristics of the inverter and the switching characteristics of the logic gates may be selected to generate pulses having a desired pulse width relative to the clock.

As illustrated in FIG. 7, in one embodiment the clock recovery and buffer circuit 410 may have rising and falling edge pulse generators 545 and 555 that are similar to those in clock buffer 405. Skewed amplifiers 550 and 560 may comprise a chain of inverters having outputs coupled to the gates of first and second field effect transistors 701 and 702 of tristate buffer 590. Referring to FIG. 7, the tri-state driver may be a distributed tri-state driver, e.g., more than one tri-state driver. In one embodiment, the output of skewed amplifier 550 drives a gate of the first field effect transistor 701 of a first polarity that is coupled in series with the second field effect transistor 702 of a second polarity. In one embodiment, each tristate driver drives one or more latches 720. Also, referring to FIG. 7, it can be seen that tap lines may be placed between the inverters of each skewed amplifier to distribute the amplification function.

In a clock signal distribution network that is a clock tree it is desirable to reduce the latency along a substantial number of lower levels of the clock tree. It is also desirable to implement a fan-out design to reduce the total number of components required to drive a given number of latches. Consequently, in one embodiment of a clock signal distribution network the clock signal is converted into rising and falling edge pulses which are fanned out across a plurality of clock tree levels as rising and falling edge pulses before recovering the clock signal.

Figure 8:
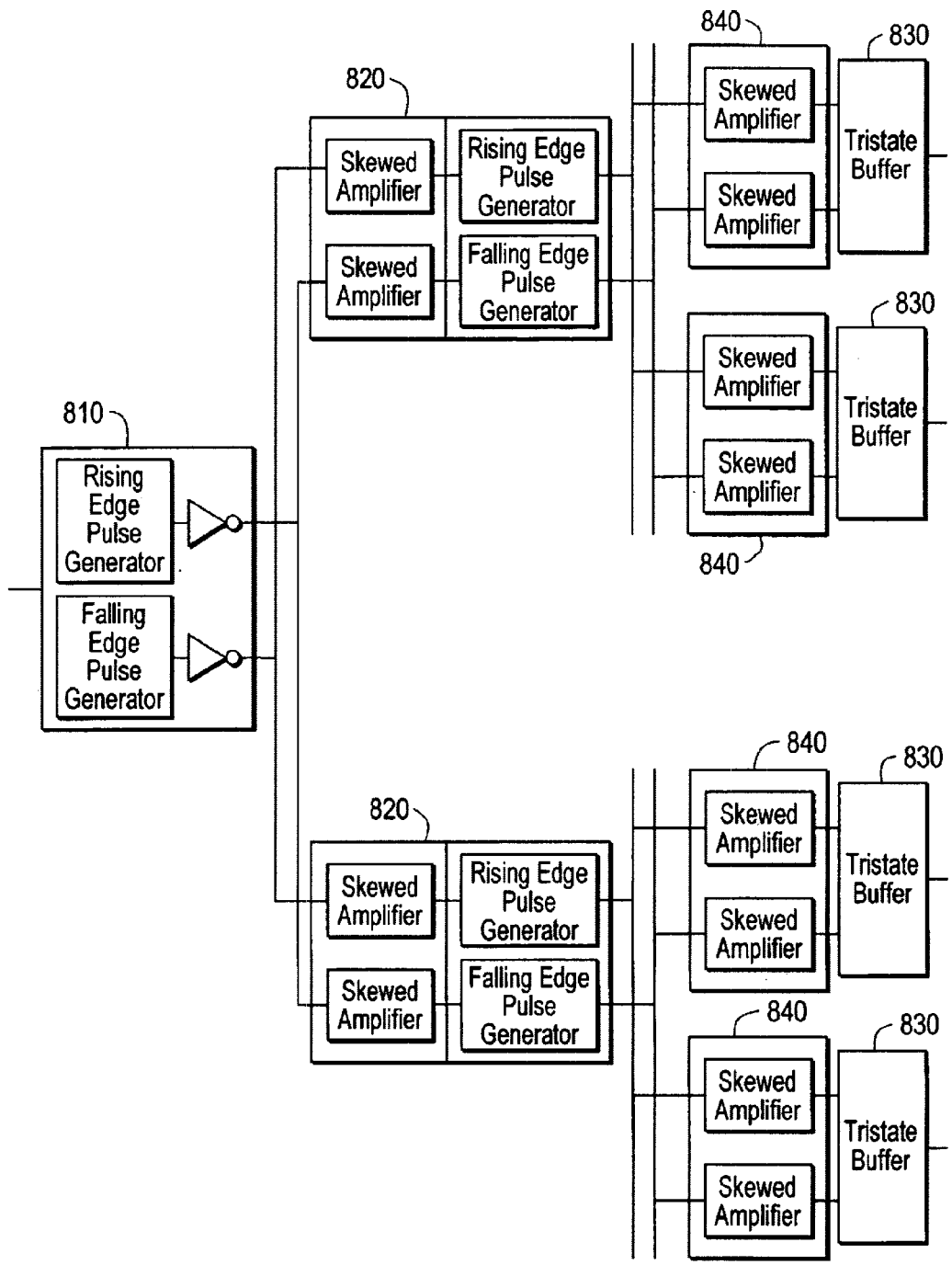
FIG. 8 is a block diagram of an embodiment of a two-wire clock distribution network having arranged to fan-out rising edge and falling edge pulses.
Figure 9:
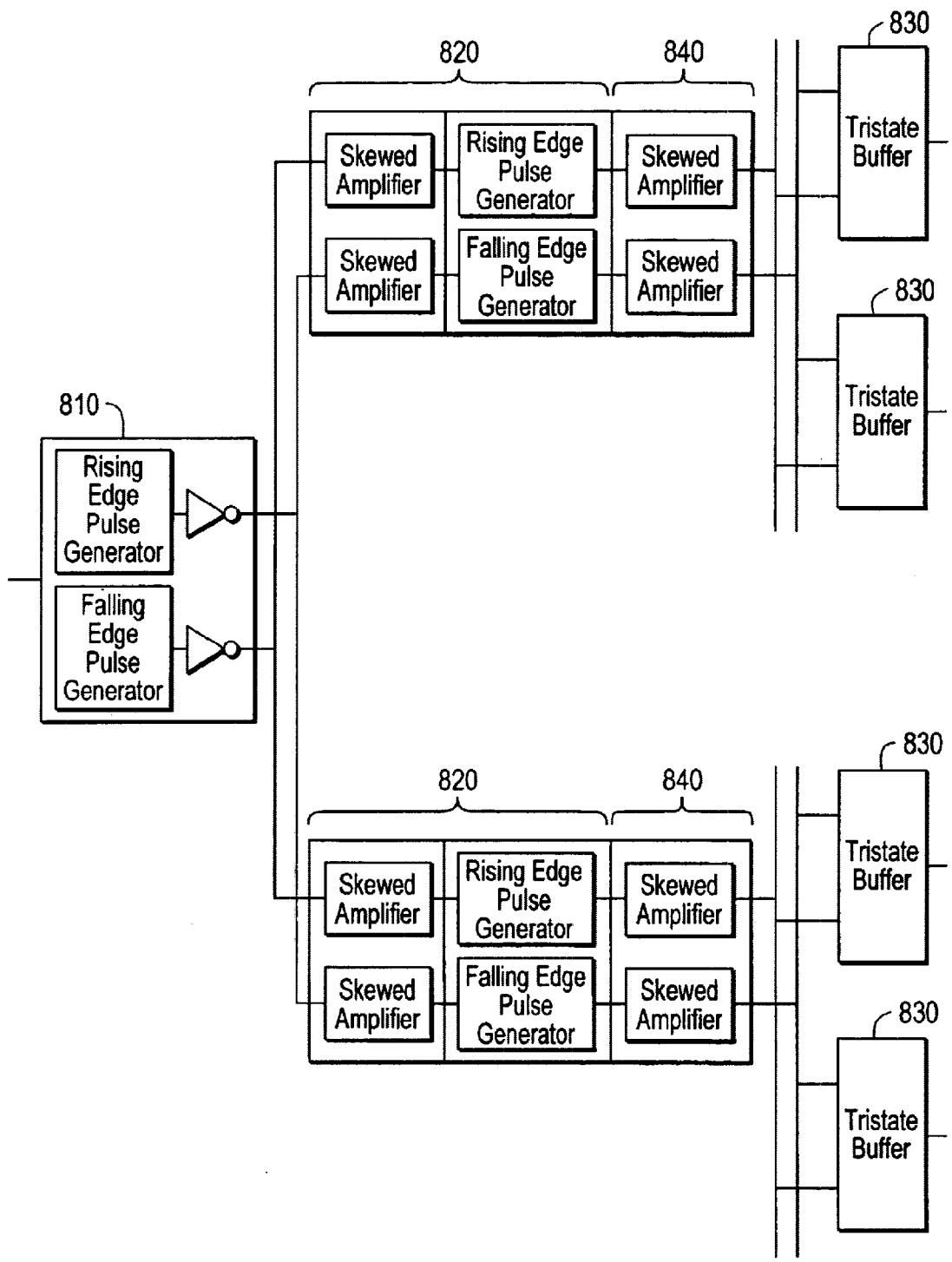
FIG. 9 is a block diagram of a second embodiment of a two-wire clock distribution network arranged to fan-out rising edge and falling edge pulses.

FIG. 8 shows a first embodiment of a clock signal distribution network in which the lower levels of the clock tree transmit rising and falling edge pulses to higher levels of the clock tree. Referring to FIG. 8, in one embodiment a rising and falling edge pulse generator 810 generates rising and falling edge clock signals for a plurality of amplifier/pulse generator stages 820. Each stage 820 may include a first skewed amplifier for amplifying a rising edge pulse coupled to a rising edge pulse generator for regenerating rising edge pulses. Additionally, each stage 820 may include a skewed amplifier for amplifying a falling edge pulse that is coupled to a falling edge pulse generator for regenerating falling edge pulses. The rising edge and falling edge pulses from each stage 820 may be used, in turn, to drive a plurality of tristate buffers 830. Each tristate buffer may, in turn, have its own skewed amplifiers 840. FIG. 9 shows another embodiment, similar to FIG. 8, except with the skewed amplifiers 840 integrated into stage 820.

Referring to FIGS. 8 and 9, it will be understood that various combinations of skewed amplifiers, pulse generators, and buses may be used to amplify and regenerate rising and falling edge clock pulses from stage 820 prior to recovery of the clock signal in a tristate buffer 830.

The present invention is compatible with a circuit design having acceptably low clock power consumption. In one embodiment, the clock signal distribution circuit is used to couple clock signals into selected regions of a microprocessor. The recovered single-wire clock signal may then be used to drive latches or other circuit elements in local regions. The local regions, which may fan out to drive a large number of latches, may be driven from conventional buffer drivers receiving the reconstructed clock signal. This provides the benefit of using a two-wire buffer clock signal distribution circuit to distribute clock signals with reduced latency from a central clock to clock distribution points. In local regions conventional clocked latches having a single wire architecture may be utilized to optimize power consumption of the clock distribution in local regions.

Figure 10:
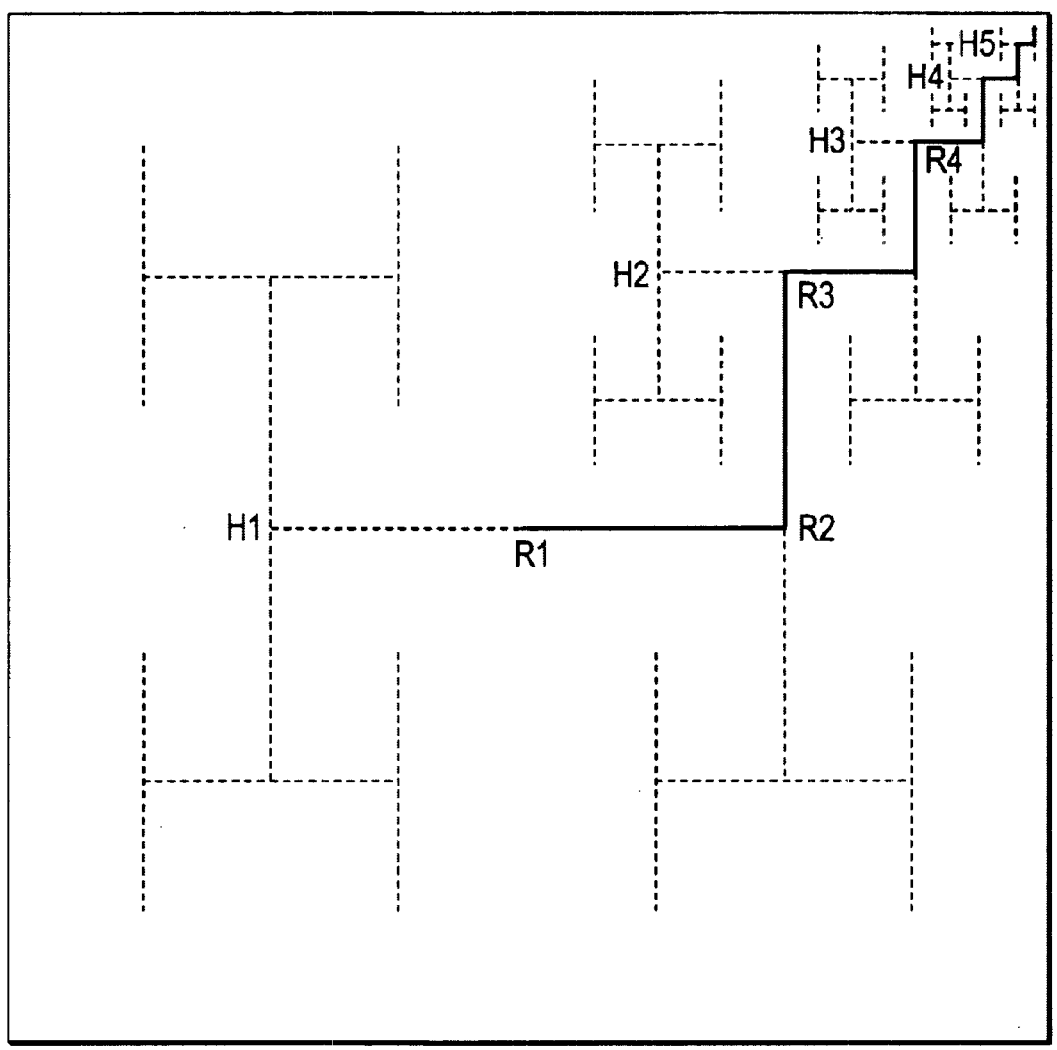
FIG. 10 is top view diagram illustrating an exemplary H-tree clock distribution network.

In one embodiment shown in FIG. 10, a clock signal distribution circuit is used as part of an H-tree architecture to couple signals from a central clock source to clock distribution points within the microprocessor. In an H-tree architecture, clock signals are distributed into progressively smaller H-shaped regions of an integrated circuit from a central clock signal. A small number of nested H's (e.g., H1, H2, H3, H4, and H5 of FIG. 10) branch to permit a clock signal to be distributed from a central source to local regions within a microprocessor. At the highest-level H's (corresponding to local regions) large numbers of clocked latches may be driven with conventional single-wire clocked circuits. In accord with the present invention, the two wire buffer may be used for low latency clock distribution between two points on the H-tree corresponding to branches. In particular, it is desirable to use the clock signal distribution circuit 700 to reduce the latency of coupling clock signals from the central clock to the highest level of the H-tree, which corresponds to H5 in FIG. 10. The attenuation of the two-wire bus is preferably optimized to reduce the number of repeaters required. Provisions must be made to account for fan-out at branch points to higher levels of the H-tree. In one embodiment, the two-wire rising/falling clock pulses may be reconstructed into a single clock signal for regeneration proximate a higher-level branch point. Alternately, repeaters may be used to boost the signal proximate a branch point.

Figure 11:
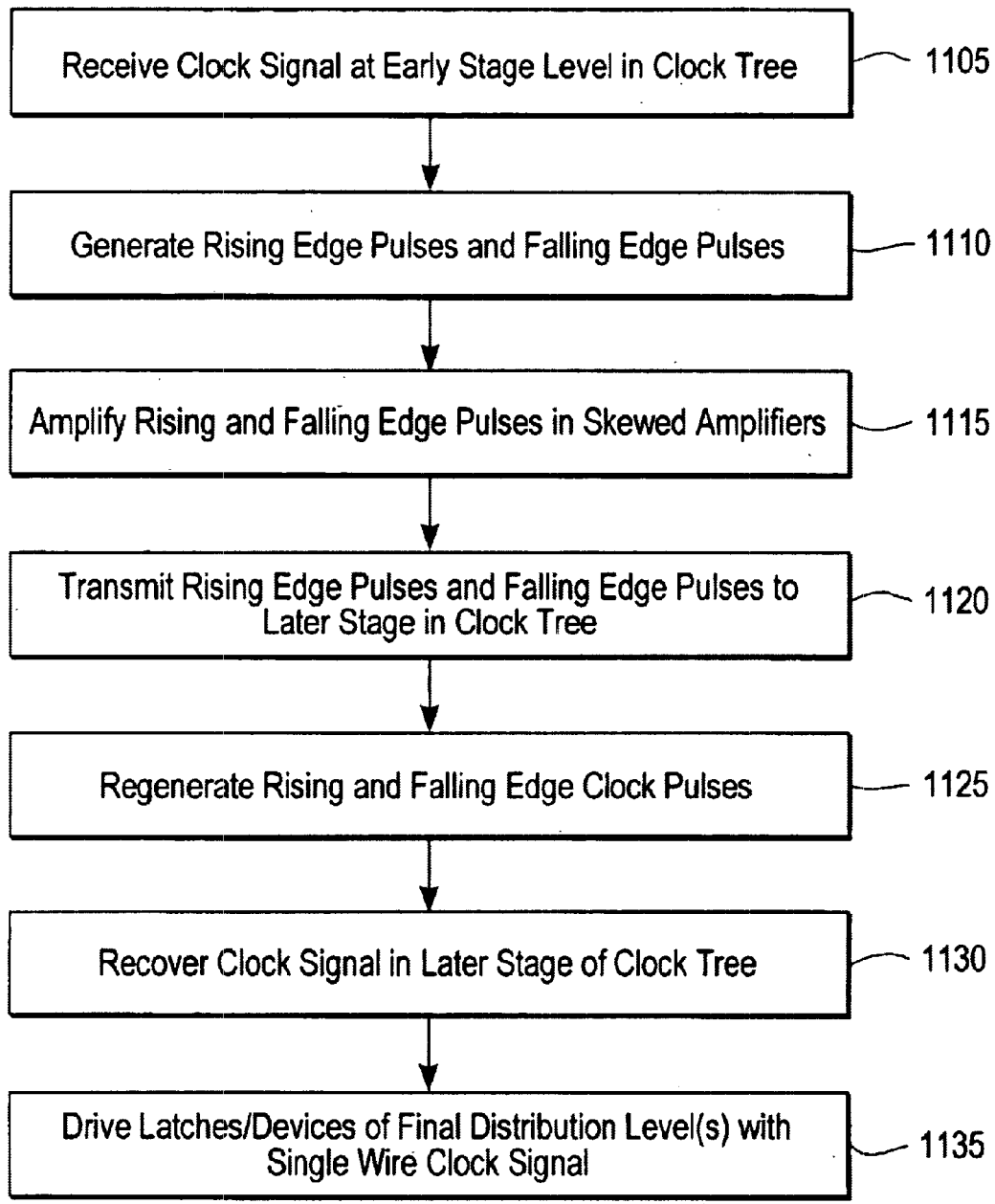
FIG. 11 is a flow chart of one embodiment of a method of operating a clock tree.

FIG. 11 is a flow chart illustrating a method of distributing clock signals in an integrated circuit. Clock signals are received at an early stage in the clock tree 1105. Rising and falling edge pulses are generated 1110. In one embodiment, the pulses are amplified in skewed amplifiers 1115 and transmitted 1120 to higher levels of the clock tree. The pulses are regenerated 1125 at another level of the clock tree and used to recover 1130 a single wire clock signal that may be used to drive latches 1135. The recovered clock signal 1130 more generally be used to drive the clock grid; the clock inputs of clocked circuits such as latches, dynamic circuits, or memories; or used as the clock input of gated local clock buffer. For example, the recovered clock signal may be used to drive circuit elements around a distribution point of the H-tree.

Referring back to FIGS. 8–9, it will be understood that in some embodiments the sequence of steps illustrated may vary from what is show in FIG. 11.

Simulations indicated that the two-wire clock distribution network of the present invention can reduce clock latency to ⅔ that of conventional single wire clock signal distribution technique. This is attributed to the increased ability to optimize the gain and skew characteristics to improve the gain per delay. The simulations indicate that an improvement in clock rate of up to 2% may be obtained using the two wire clock signal distribution technique. Clock jitter is typically approximately 5% of processor clock rate (frequency). The 2% improvement in clock rate is attributed to the decrease in clock jitter brought about by the decrease in clock latency. A slight increase in overall clock power consumption may occur. Consequently, it is desirable that the two wire bus and other circuits be optimized to reduce their power consumption. Moreover, as previously discussed, in a clock tree the number of elements in each level of the tree increases in successive levels of the tree due to the fan out. In one embodiment, the two wire distribution technique is used for all of the lower levels of the clock distribution network and the upper 1–3 levels (which have the largest number of buffer elements) are implemented using single wire clock buffers.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A clock signal distribution network for an integrated circuit, comprising:
   a buffer circuit receiving a clock signal and generating a first signal indicative of each instance of a rising edge of the clock signal and generating a second signal indicative of each instance of a falling edge of the clock signal;
   a clock recovery circuit, at a clock distribution point, configured to recover the clock signal from the clock information associated with the first signal and the second signal; and
   a bus coupling the first and second signals from the buffer circuit to the clock recovery.

2. The network of claim 1, wherein the first signal includes a first type of pulse triggered by each instance of the rising edge of the clock signal and the second signal includes a second type of pulse triggered by each instance of the falling edge of the clock signal.

3. A clock signal distribution network for an integrated circuit, comprising:
   a buffer circuit receiving a clock signal and generating a first signal including a first type of pulse indicative of each instance of a rising edge of the clock signal and generating a second signal including a second type of pulse indicative of each instance of a falling edge of the clock signal, the buffer circuit comprising at least two skewed amplifiers configured to amplify the first and second types of pulses;
   a clock recovery circuit configured to recover the clock signal from the clock information associated with the first signal and the second signal; and
   a bus coupling the first and second signals from the buffer circuit to the clock recovery.

4. The network of claim 3, wherein the clock recovery circuit detects the leading edges of the first and second types of pulses and regenerates the pulses.

5. The network of claim 4, wherein the clock recovery circuit further comprises skewed amplifiers for amplifying the first and second types of pulses.

6. The network of claim 5, wherein the clock recovery circuit further comprises a tristate buffer adapted to recover the clock signal responsive to the first and second types of pulses.

7. A clock signal distribution network for an integrated circuit, each clock pulse of the clock signal having a rising edge and a falling edge, the network comprising:
   a first pulse generator stage residing at a first clock signal distribution point receiving the clock signal and generating a first pulse signal comprising one pulse for the rising edge of each clock pulse and a second pulse signal comprising one pulse for the falling edge of each clock pulse;
   a first amplifier stage coupled to the first pulse generator stage having at least two skewed amplifiers adapted to separately amplify the first and second pulse signals, the first amplifier stage having skew characteristics favoring the propagation of the leading edges of the pulses of the first and second pulse signals;
   a second pulse generator stage residing at a second clock distribution point receiving the first and second pulse signals, the second pulse generator generating a third pulse signal comprising one pulse for the leading edge of each pulse of the first pulse signal and a fourth pulse signal comprising one pulse for the leading edge of each pulse of the second pulse signal;

a second amplifier stage coupled to the second pulse generator stage having at least two skewed amplifiers for separately amplifying the third and fourth pulse signals, the second amplifier stage having skew characteristics selected so that the pulses of the third and fourth pulse signals are non-overlapping;

a buffer stage receiving the third and fourth pulse signals from the second amplifier stage configured to recover the clock signal; and an at least one bus to couple the first and second pulse signals on separate wires between at least two of the stages.

8. The network of claim 7, wherein:

at least one bus includes a two-wire bus having separate wires for transmitting the first and second pulses.

9. The network of claim 8, wherein:

the two-wire bus couples the first and second pulse signals of the first amplifier stage to the second pulse generator stage.

10. The network of claim 9, wherein the first amplifier stage is configured to skew the pulses of the first and second pulse signals with a pulse width of each pulse that is greater than half the clock period and less than the clock period.

11. The network of claim 7, wherein the first amplifier stage includes a first skewed amplifier to amplify the first pulse signal and a second skewed amplifier configured to amplify the second pulse signal.

12. The network of claim 11, wherein the first amplifier stage comprises:

a first chain of skewed inverters arranged to amplify the first pulse signal; and a second chain of skewed inverters arranged to amplify the second pulse signal.

13. The system of claim 12, wherein each of the inverters have their switching points selected so that the pulse width of the output of the first and second chains of inverters is between about 5% to 95% of the clock period.

14. The system of claim 8, wherein the first pulse generator stage is coupled to the first skewed amplifier stage by a two-wire bus.

15. A clock signal distribution system for an integrated circuit, comprising:

pulse generator means for generating a first pulse signal having one pulse for each rising edge of a clock signal and for generating a second pulse signal having one pulse for each falling edge of the clock signal;

skewed amplifier means for amplifying the first and second pulse signals;

pulse generator and skewed amplifier means for regenerating and amplifying the first and second pulse signals;

clock recovery means for recovering the clock signal from the regenerated and amplified first and second pulse signals; and at least one bus for coupling the first and second pulse signals from the skewed amplifier means to the pulse generator and amplifier means.

16. A clock signal distribution network for a clock having clock pulses with a rising edge, a leading edge, and a clock period, the network comprising:

a clock buffer circuit disposed proximate to a first distribution point of a clock tree for receiving a clock signal and generating a first pulse signal having one pulse for the rising edge of each clock pulse and generating a second pulse signal having one pulse for the falling edge of each clock pulse, the pulses of the first and second pulse signals having a duty cycle in a range between about 5% to 95% of the clock period;

a two-wire bus having a first wire for transmitting the first pulse signal to a second distribution point and a second wire for transmitting the second pulse signal to the second distribution point;

a clock recovery circuit disposed proximate to the second distribution point coupled to the first and second wires configured to detect the leading edges of the first and second pulse signals and recover the clock signal.

17. The network of claim 16, wherein the recovered clock signal of the clock recovery circuit is coupled to a single wire bus for driving a plurality of latches amplifying the regenerated first pulse signal in a fourth skewed amplifier; and inputting the first and second pulse signals into a tristate buffer to recover the clock signal.

18. The network of claim 16, wherein the clock buffer circuit comprises:

a first pulse generator receiving a clock signal and generating rising-edge signal pulses having a duty cycle of less than 50%;

a second pulse generator receiving the clock signal and generating falling-edge signal pulses with a duty cycle of less than 50% for each clock pulse;

a first chain of skewed amplifiers configured to amplify the rising edge signal pulses with a duty cycle in a range between about 5% to 95% of the clock period; and a second chain of skewed amplifiers configured to amplify the falling edge signal pulses with a duty cycle eater than 50% but less than 100%.

19. The network of claim 16, wherein the clock recovery circuit comprises:

a rising edge pulse generator for generating a rising edge pulse having a pulse width in a range of between about 5% to 45% of the clock period responsive to detecting the leading edge of each pulse of the first pulse signal;

a third chain of skewed amplifiers coupled to the rising edge pulse generator configured to amplify the rising edge pulse with a duty cycle of less than 50%;

a falling edge pulse generator for generating a falling edge pulse having a pulse width in a range of between about 5% to 45% of the clock period responsive to detecting a leading edge of each pulse of the second pulse signal;

a fourth chain of skewed amplifiers configured to amplify the falling edge pulses with a duty cycle of less than 50%; and a buffer circuit receiving the output of the third and fourth chain of skewed amplifiers configured to generate an output signal that is a recovered clock signal;

wherein the pulse duty cycle and skew characteristics of the circuit are selected so that the buffer circuit receives rising and falling edge pulse with a sufficiently small duty cycle to permit the clock signal to be recovered.

20. A clock distribution network, comprising:

clock buffer means for generating a rising edge pulse signal and a falling edge pulse signal from each clock pulse;

a bus for coupling the rising edge pulse signal and the falling edge pulse signal to a clock distribution point;

clock recovery means for generating a recovered clock signal from the rising edge pulse signal and the falling edge pulse signal at the clock distribution point.

21. A method of distributing a clock signal in an integrated circuit, the method comprising:

for each rising edge of a clock signal, generating one pulse responsive to detecting the rising edge of the clock signal to form a first pulse signal having a first sequence of pulses;

amplifying the first pulse signal in a first skewed amplifier, whereby each pulse of the first sequence of pulses has a favored leading edge and an increase in pulse width;

for each falling edge of a clock signal, generating one pulse responsive to detecting the falling edge of the clock signal to form a second pulse signal having a second sequence of pulses;

amplifying the second pulse signal in a second skewed amplifier, whereby each pulse of the second sequence of pulses has a favored leading edge and an increase in pulse width;

coupling the first and second pulse signals to a clock distribution point;

at the clock distribution point, regenerating the first pulse signal by detecting the leading edge of each of its pulses and generating a new pulse for each leading edge;

amplifying the regenerated first pulse signal in a third skewed amplifier;

at the clock distribution point, regenerating the second pulse signal by detecting the leading edge of each of its pulses and generating a new pulse for each leading edge;

amplifying the regenerated first pulse signal in a fourth skewed amplifier; and inputting the first and second pulse signals into a tristate buffer to recover the clock signal.

22. The method of claim 21, wherein the first and second skewed amplifiers are configured so that a temporal pulse length of the rising and falling edge pulses is less than a full clock period by a sufficient margin to permit the rising and falling edge pulses to be regenerated.

23. The method of claim 21, further comprising:

coupling the recovered clock signal at the second distribution point to a driver; and driving a plurality of latches proximate to the second distribution point.

24. The method of claim 21, wherein the third and fourth skewed amplifiers are configured so that the inputs to the tristate buffer are non-overlapping.

25. A method of distributing clock signals, comprising:

for each instance of a rising edge of a clock pulse, generating at least one signal indicative of the instance of the rising edge;

for each instance of a falling edge of the clock pulse, generating at least one signal indicative of the instance of the falling edge;

at another clock distribution point, recovering the clock signal from the timing information associated with the at least one signal indicative of the instance of the rising edge and the at least one signal indicative of the instance of the falling edge.

26. A method of distributing clock signals, the method comprising:

receiving a clock signal at a first distribution point;

for each instance of a rising edge of the clock signal, generating a rising edge pulse having a duty cycle in a range between about 5% to about 45% of the clock period;

amplifying the rising edge pulse in a chain of skewed inverters having a sufficient number of stages to amplify the rising edge clock signal with a pulse duty cycle in a range between about 5% to about 95% of the clock period;

for each instance of a falling edge of the clock signal, generating a falling edge pulse having a duty cycle between about 5% to about 45% of the clock period;

amplifying the falling edge clock pulse in a chain of skewed inverters having a sufficient number of stages to amplify the falling edge clock signal with a duty cycle in a range between about 5% to 95% of the clock period;

transmitting the rising and falling edge pulses on separate wires of a two wire buffer to a second distribution point;

regenerating the rising edge pulses at the second distribution point to have a duty cycle substantially in the range of between about 5% to 45%;

amplifying the rising edge pulses in a skewed amplifier having a sufficient number of stages to achieve a duty cycle of less than 50%;

regenerating the falling edge pulses to have a duty cycle substantially in the range of between about 5% to 45%; and amplifying the rising edge pulses in a skewed amplifier chain having a sufficient number of stages to form amplified reset rising edge pulses and amplified falling edge pulses achieve a duty cycle of less than 45%; and recovering the clock signal from the amplified regenerated rising and falling edge pulses.

27. A method of distributing clock signals, comprising:

receiving a clock signal at a first distribution point;

generating rising edge pulses each having a leading edge indicative of an instance of a rising edge of a corresponding clock pulse;

generating falling edge pulses each having a leading edge indicative of an instance of a falling edge of a corresponding clock pulse;

transmitting the rising edge pulses and falling edge pulses to a second distribution point;

generating a recovered clock signal at the second distribution point from the rising edge pulses and the falling edge pulses; and distributing the recovered clock signal.

28. A system to distribute a clock signal, comprising:

pulse generating means, located at a first point, for generating a first pulse indicative of a rising edge of a clock signal and a second pulse indicative of the falling edge of the clock signal in response to receiving the clock signal; and clock generating means, located at a second point at a different level in a clock tree than the first point, for generating a recovered clock signal responsive to receiving the first pulse and the second pulse.

29. A system of claim 28, further comprising:

a location coupling means for coupling the first location to the second location.

30. A system of claim 29, wherein the location coupling means is configured for transmitting the first pulse and the second pulse from the first location to the second location.

31. A system of claim 29, wherein the location coupling means comprises a two-wire bus.

32. A system of claim 29, wherein location coupling means is configured for separately transmitting the first signal and the second signal.

33. A system of claim 28, wherein the pulse generating means is configured for generating the first pulse and the second pulse as leading edges.

34. A system of claim 28, wherein the pulse generating means is configured for separately outputting the first pulse and the second pulse and the clock generating means is configured for separately receiving the first pulse and the second pulse.

35. A system of claim 28, further comprising:
amplifying means for amplifying the first pulse and the second pulse with skew characteristics optimized for low latency.

* * * * *

UNITED STATES PATENT AND TRADEMARK OFFICE
CERTIFICATE OF CORRECTION

PATENT NO. : 6,630,851 B2
DATED : October 7, 2003
INVENTOR(S) : Robert P. Masleid It is certified that error appears in the above-identified patent and that said Letters Patent is hereby corrected as shown below:

<u>Title page,</u>
Item [57], ABSTRACT,
Line 4, add -- and a second -- after "clock pulse".
Line 10, delete the word "pulse." and replace with -- pulses. --.
Line 12, add the word -- input -- after "and".

<u>Column 11,</u>
Line 14, add the word -- the -- before the word "at".

<u>Column 12,</u>
Line 32, delete the word "eater" and replace with -- greater --.

Signed and Sealed this

Thirteenth Day of January, 2004

JON W. DUDAS
*Acting Director of the United States Patent and Trademark Office*